(12) United States Patent
Kubota et al.

(10) Patent No.: US 9,217,922 B2
(45) Date of Patent: Dec. 22, 2015

(54) LIQUID PROCESSING APPARATUS, LIQUID PROCESSING METHOD AND STORAGE MEDIUM FOR LIQUID PROCESSING

(71) Applicant: TOKYO ELECTRON LIMITED, Tokyo (JP)

(72) Inventors: Minoru Kubota, Koshi (JP); Kousuke Yoshihara, Koshi (JP); Kouzou Tachibana, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 182 days.

(21) Appl. No.: 13/949,733

(22) Filed: Jul. 24, 2013

(65) Prior Publication Data

US 2014/0030423 A1 Jan. 30, 2014

(30) Foreign Application Priority Data

Jul. 26, 2012 (JP) ................................ 2012-165319

(51) Int. Cl.
*G03F 7/16* (2006.01)
*B05C 5/02* (2006.01)
*H01L 21/67* (2006.01)
*B05C 11/10* (2006.01)
*B05C 11/08* (2006.01)
*B08B 3/10* (2006.01)
*B08B 3/08* (2006.01)

(52) U.S. Cl.
CPC . *G03F 7/16* (2013.01); *B05C 11/08* (2013.01); *B05C 11/1002* (2013.01); *G03F 7/162* (2013.01); *H01L 21/6715* (2013.01); *H01L 21/67051* (2013.01); *H01L 21/67178* (2013.01); *B05C 5/0258* (2013.01); *B08B 3/08* (2013.01); *B08B 3/10* (2013.01)

(58) Field of Classification Search
CPC ...................... H01L 21/6715; H01L 21/67051; H01L 21/67178; G03F 7/16; G03F 7/162; B05C 11/1002; B05C 11/08; B05C 5/0258; B08B 3/08; B08B 3/10
USPC ......... 118/600, 602, 603, 610, 666, 696, 697, 118/708, 712, 52, 56, 319, 320; 134/902
See application file for complete search history.

(56) References Cited

U.S. PATENT DOCUMENTS

| 6,409,838 B1 * | 6/2002 | Sakai ............................. 118/725 |
| 7,086,410 B2 * | 8/2006 | Chouno et al. .................. 137/14 |
| 2009/0013932 A1 * | 1/2009 | Sakamoto ..................... 118/719 |

FOREIGN PATENT DOCUMENTS

| JP | 03288569 A | 12/1991 |
| JP | 11003851 A | 1/1999 |
| JP | 2007-67059 A | 3/2007 |

*Primary Examiner* — Laura Edwards
(74) *Attorney, Agent, or Firm* — Nath, Goldberg & Meyer; Jerald L. Meyer (57) ABSTRACT

A liquid processing apparatus includes a substrate holding unit arranged within a processing cup and configured to horizontally hold a substrate, a rotating mechanism configured to rotate the substrate holding unit about a vertical axis, a processing liquid supply unit configured to supply a processing liquid onto a surface of the substrate, and an exhaust mechanism configured to discharge an atmospheric gas around the substrate. The exhaust mechanism includes an exhaust flow path connected to an exhaust port formed at the processing cup, a circulation flow path branched from the exhaust flow path and configured to communicate with the processing cup, a gas liquid separator, a first regulator valve installed at one end of the exhaust flow path, and a second regulator valve installed at the other end of the exhaust flow path.

6 Claims, 9 Drawing Sheets

LIQUID PROCESSING APPARATUS, LIQUID PROCESSING METHOD AND STORAGE MEDIUM FOR LIQUID PROCESSING

CROSS-REFERENCE TO RELATED APPLICATION

This application claims the benefit of Japanese Patent Application No. 2012-165319, filed on Jul. 26, 2012, in the Japan Patent Office, the disclosure of which is incorporated herein in its entirety by reference.

TECHNICAL FIELD

The present disclosure relates to a liquid processing apparatus, a liquid processing method and a non-transitory storage medium for liquid processing.

BACKGROUND

In a semiconductor manufacturing process, a specified resist pattern is formed on a substrate, e.g., a semiconductor wafer, by performing a photolithography process that includes a resist coating step in which a resist film is formed by supplying of a resist liquid as a processing liquid onto a surface of the substrate kept on a horizontal plane while rotating the substrate about a vertical axis, a heating (prebaking) step for evaporating and removing a solvent remaining within the resist film after coating the resist liquid, an exposing step for exposing the resist film in a specified pattern, a heating (post-exposure baking) step for inducing a chemical reaction within the resist film after exposure and a developing step for developing the exposed resist film.

Conventionally, in the photolithography process, a processing system in which an exposure apparatus is connected to coating and developing apparatuses is used.

In a photoresist process performed in the processing system, a liquid processing through the use of a spin coating method is generally performed. As a conventional apparatus for performing this kind of liquid processing, there is known a liquid processing apparatus that includes a substrate holding unit arranged within a processing cup having an open top end and configured to horizontally hold a substrate, a rotating mechanism for rotating the substrate holding unit about a vertical axis, a processing liquid supply unit for supplying a processing liquid on the surface of the substrate, a suction means for sucking an unnecessary atmospheric gas within the processing cup through an exhaust port at the bottom of the processing cup, and an intake port for drawing an ambient air into the processing cup.

In the conventional technology, the intake port for drawing an ambient air into the processing cup and the exhaust port for discharging a gas out of the processing cup are formed in the processing cup. For that reason, an exhaust flow path is formed within the processing cup. Consequently, the mist generated from the liquid process (coated film forming process) can be discharged even with a small suction force.

In recent years, however, the diameter of a substrate has increased, and a substrate of 450 mm in diameter is used in place of a conventional substrate of 300 mm in diameter. When the substrate of 450 mm in diameter is subjected to the liquid process (coated film forming process), it is expected that, in the structure of the conventional liquid processing apparatus, the processing cup exhaust flow rate required to prevent the mist generation is increased approximately twice in terms of the conventional processing ratio. The amount of air to be supplied into the processing cup to secure the internal pressure of the liquid processing apparatus is also increased like the processing cup exhaust flow rate. Accordingly, there is likelihood that the factory power consumption that accounts for the operation cost of the liquid processing apparatus becomes higher.

In the conventional technology, however, since the unnecessary atmospheric gas generated within the processing cup and the ambient air drawn from the intake port are discharged to the factory outside the liquid processing apparatus by the suction force of the suction means installed in the exhaust flow path connected to the exhaust port, the amount of the gas discharged to the factory does not grow smaller. This may make it impossible to reduce the factory power consumption that accounts for the operation cost of the liquid processing apparatus.

SUMMARY

Some embodiments of the present disclosure provide a liquid processing apparatus, a liquid processing method and a non-transitory storage medium for liquid processing, which are capable of efficiently using an exhaust gas by allowing the exhaust gas, from which the mist generated by liquid processing is removed, to circulate through a processing cup, capable of reducing the flow rate of the exhaust gas discharged to a factory and the power usage required in discharging the exhaust gas to the factory, and capable of reducing the volume of an air supplied to the processing cup.

According to one embodiment of the present disclosure, there is provided a liquid processing apparatus, including: a substrate holding unit arranged within a processing cup having an open top end and configured to horizontally hold a substrate, a rotating mechanism configured to rotate the substrate holding unit about a vertical axis, a processing liquid supply unit configured to supply a processing liquid onto a surface of the substrate; and an exhaust mechanism configured to discharge an atmospheric gas around the substrate held by the substrate holding unit, the exhaust mechanism includes: an exhaust flow path communicating with an exhaust port formed in a bottom portion of the processing cup at a first end while communicating with an outside at a second end and provided with an exhaust device installed in the exhaust flow path, a circulation flow path branched from a branching portion of the exhaust flow path to communicate with the processing cup, a gas liquid separator installed at the branching portion, and configured to separate the atmospheric gas into a mist and a gas, a first regulator valve installed at the first end of the exhaust flow path and capable of being opened and closed and capable of adjusting an opening degree, and a second regulator valve installed at the second end of the exhaust flow path and capable of being opened and closed.

According to another embodiment of the present disclosure, there is provided a liquid processing method using a liquid processing apparatus including a substrate holding unit arranged within a processing cup having an open top end and configured to horizontally hold a substrate, a rotating mechanism configured to rotate the substrate holding unit about a vertical axis, a processing liquid supply unit configured to supply a processing liquid onto a surface of the substrate, and an exhaust mechanism configured to discharge an atmospheric gas around the substrate held by the substrate holding unit, the exhaust mechanism including an exhaust flow path communicating with an exhaust port formed in a bottom portion of the processing cup at a first end while communicating with an outside at a second end and provided with an exhaust device installed in the exhaust flow path, a circulation flow path branched from a branching portion of the exhaust flow path to communicate with the processing cup, a gas liquid separator installed at the branching portion, configured to separate the atmospheric gas into a mist and a gas, a first regulator valve installed at the first end of the exhaust flow path and capable of being opened and closed and capable of adjusting an opening degree, and a second regulator valve installed at the second end of the exhaust flow path and capable of being opened and closed, the method including: a processing operation in which a processing liquid film is formed on the surface of the substrate by supplying the processing liquid from the processing liquid supply unit onto the surface of the substrate rotating about the vertical axis, an exhaust gas circulating operation in which the gas separated by the gas liquid separator is introduced into the processing cup from the circulation flow path by opening the first regulator valve and closing the second regulator valve, and a discharging operation in which the gas existing in the exhaust flow path is discharged by closing the first regulator valve and opening the second regulator valve, wherein, during the processing operation, the exhaust gas circulating operation is performed such that the atmospheric gas around the substrate within the processing cup is guided toward the exhaust port by the gas introduced into the processing cup from the circulation flow path, and after stopping the processing operation and the exhaust gas circulating operation, the discharging operation is performed.

According to a still further embodiment of the present disclosure, there is provided a non-transitory computer-readable storage medium that stores software for causing a computer to execute a control program, wherein upon executing the control program, the computer controls a liquid processing apparatus such that the above described method is performed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the subject specification, description will be made on a processing system in which a liquid processing apparatus according to the present disclosure is applied to a resist coating apparatus and in which an exposing apparatus is connected to coating and developing apparatuses.

Figure 1:
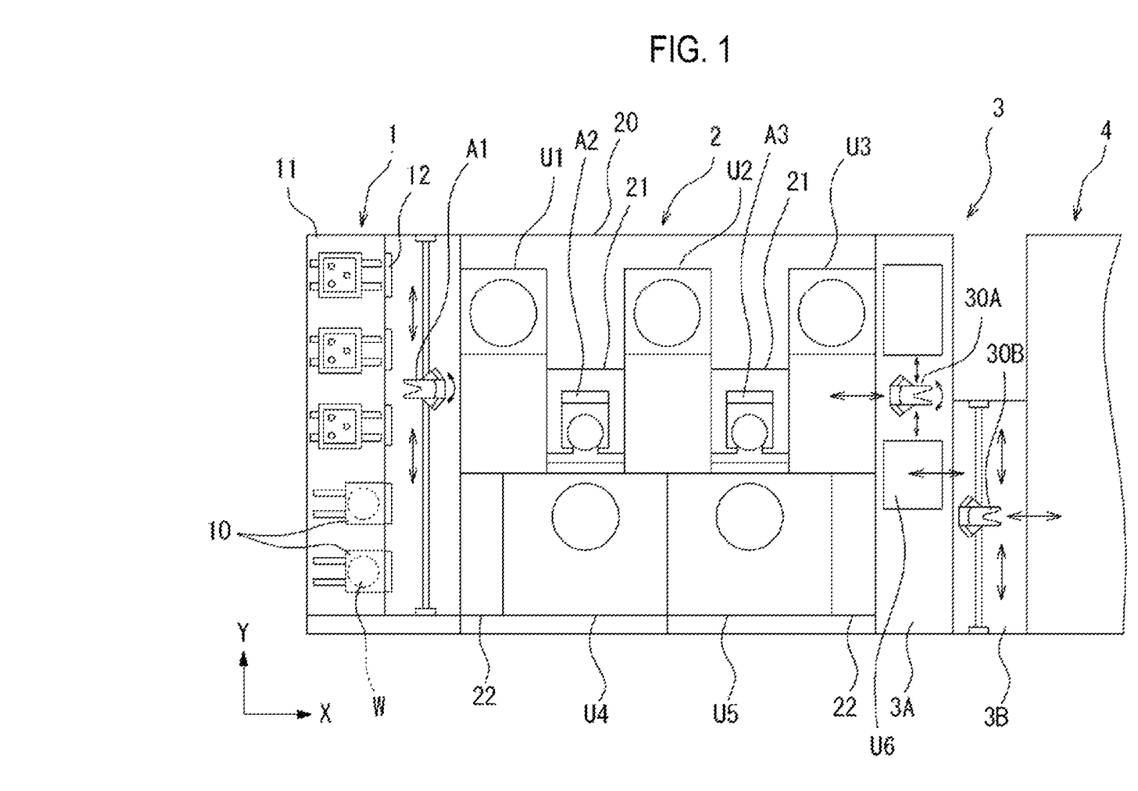
FIG. 1 is a schematic plan view showing the entirety of a processing system in which an exposing apparatus is connected to coating and developing apparatuses employing a liquid processing apparatus according to the present disclosure.

Referring to FIG. 1, the processing system includes a carrier station 1 for loading and unloading a carrier 10 which air-tightly stores a plurality of, e.g., twenty five, semiconductor wafers W (hereinafter referred to as wafer W) as target substrates, a processing station 2 where resist coating and developing, etc., are performed with respect to the wafer W supplied from the carrier station 1, an exposing station 4 where the surface of the wafer W is liquid-immersed and exposed after a light-transmitting liquid layer has been formed on the surface of the wafer W, and an interface station 3 positioned between the processing station 2 and the exposing station 4 and configured to transfer the wafer W.

The carrier station 1 includes a placing part 11 capable of placing a plurality of carriers 10 side by side, an opening/closing part 12 installed on a front wall surface when seen from the placing part 11, and a delivery means A1 for taking out the wafer W from the carriers 10 through the opening/closing part 12.

The processing station 2 surrounded by a housing 20 is connected to the inner side of the carrier station 1. When seen from the carrier station 1, shelf units U1, U2 and U3 as multi-staged heating/cooling units are arranged in the named order from the left front side. Liquid processing units U4 and U5 are arranged at the right side. Main transfer means A2 and A3 for transferring the wafer W between the shelf units U1, U2 and U3 are alternately arranged between the shelf units U1, U2 and U3. Each of the main transfer means A2 and A3 is arranged within a space surrounded by a division wall 21. The division wall 21 includes two surfaces arranged in a direction of X in FIG. 1, respectively, a front surface at the side of the liquid processing units U4 and U5 to be described later, and a rear surface at a side opposite to the front surface. Temperature/humidity control units 22 each including a device for controlling the temperature of a processing liquid used in the respective units, a temperature/humidity control duct and so forth are arranged between the carrier station 1 and the processing station 2 and between the processing station 2 and the interface station 3.

The interface station 3 includes a first conveying room 3A and a second conveying room 3B which are arranged along the front-rear direction between the processing station 2 and the exposing station 4. A first wafer conveying unit 30A is installed in the first conveying room 3A. A second wafer conveying unit 30B is installed in the second conveying room 3B.

Figure 2:
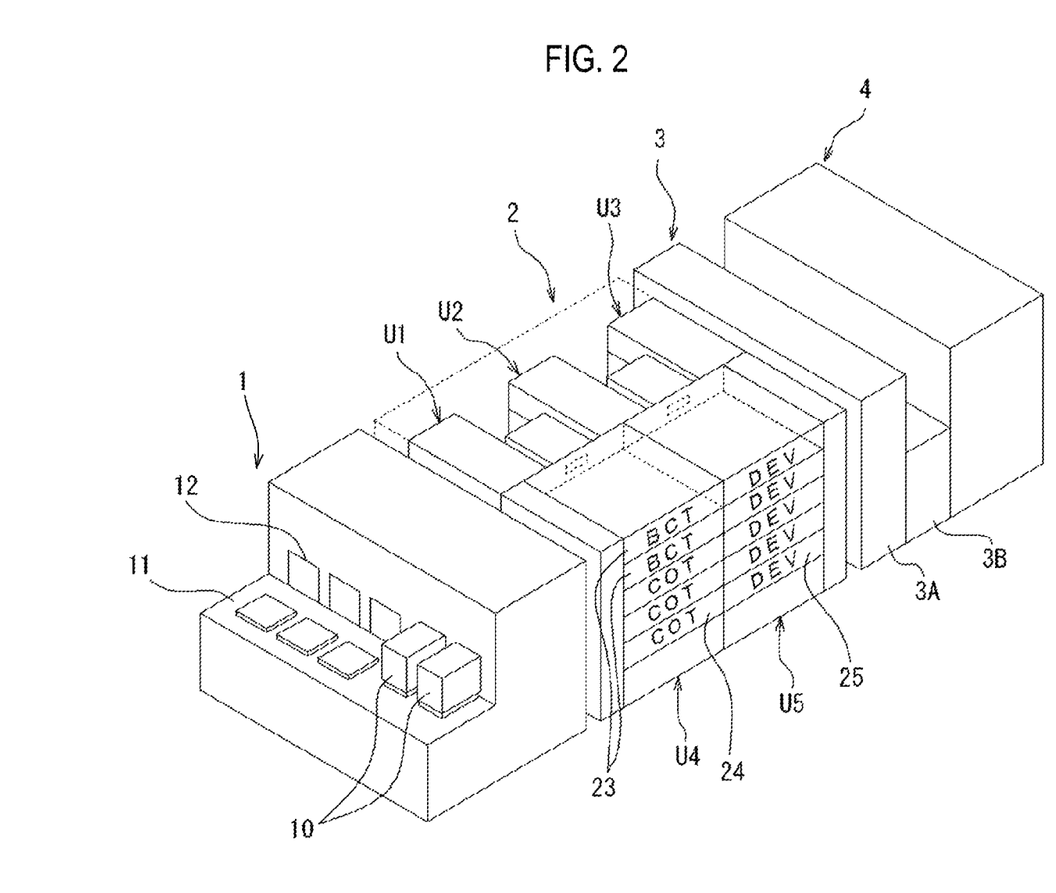
FIG. 2 is a schematic perspective view of the processing system.

Each of the shelf units U1, U2 and U3 is formed by stacking, in multiple stages, e.g., ten stages, different kind of units for performing pre-processing and post-processing to be carried out in the liquid processing units U4 and U5. The units for performing pre-processing and post-processing include a heating unit (HP) for heating (baking) the wafer W and a cooling unit (CPL) for cooling the wafer W and so forth. As shown in, e.g., FIG. 2, each of the liquid processing units U4 and U5 is formed by stacking, in multiple stages, e.g., five stages, a plurality of bottom anti-reflection film coating unit (BCT) 23 configured to coat an anti-reflection film on a unit storing a chemical solution such as a resist or a developing solution, a plurality of coating unit (COT) 24, and a plurality of developing unit (DEV) 25 configured to supply a developing solution on the wafer W to develop the wafer W. A resist coating apparatus 40 as a liquid processing apparatus according to the present disclosure is installed in the coating units (COT) 24.

Next, brief description will be made on the flow of the wafer W in the aforementioned processing system. If the carrier 10 storing the wafer W is supplied from the outside and placed on the placing part 11, the lid of the carrier 10 is removed together with the opening/closing part 12. The wafer W is taken out by the delivery means A1. Then, the wafer W is delivered to the main transfer means A2 through a delivery unit making up one stage of the shelf unit U1. In one of the shelf units U1, U2 and U3, the formation of an anti-reflection film, the substrate temperature adjustment by the cooling unit, and so forth, are performed as pre-processing of coating.

Thereafter, the wafer W is loaded into the coating unit (COT) 24 by the main transfer means A2. A resist film is formed on the surface of the wafer W. The wafer W having the resist film formed thereon is unloaded to the outside by the main transfer means A2 and is loaded into the heating unit where the wafer W is baked at a specified temperature. The baked wafer W is cooled in the cooling unit and is then loaded into the interface station 3 via the delivery unit of the shelf unit U3. The wafer W is loaded into the exposing station 4 through the interface station 3. In case where a protective film for liquid immersion exposure is coated on the resist film, the coating of a chemical solution for the protective film is performed by a unit (not shown) in the processing station 2 after the wafer W is cooled by the cooling unit. Thereafter, the wafer W is loaded into the exposing station 4 and is subjected to liquid immersion exposure. In this case, prior to the liquid immersion exposure, the wafer W may be washed by a substrate washing apparatus (not shown) installed in the interface station 3.

The wafer W subjected to the liquid immersion exposure is taken out from the exposing station 4 by the second wafer conveying unit 30B and is loaded into the heating unit (PEB) making up one stage of the shelf unit U6. Thereafter, the wafer W is unloaded from the heating unit (PEB) by the first wafer conveying unit 30A and is delivered to the main transfer means A3. Then, the wafer W is loaded into the developing unit 25 by the main transfer means A3. In the developing unit 25, the wafer W is subjected to developing and washing. Thereafter, the wafer W is unloaded from the developing unit (DEV) 25 of the shelf unit U5 by the main transfer means A3 and is returned to the original carrier 10 on the placing part 11 by way of the main transfer means A2 and the delivery means A1.

<First Embodiment>

An embodiment of a resist coating apparatus employing the liquid processing apparatus of the present disclosure will be described with reference to FIGS. 3 to 6B.

Figure 3:
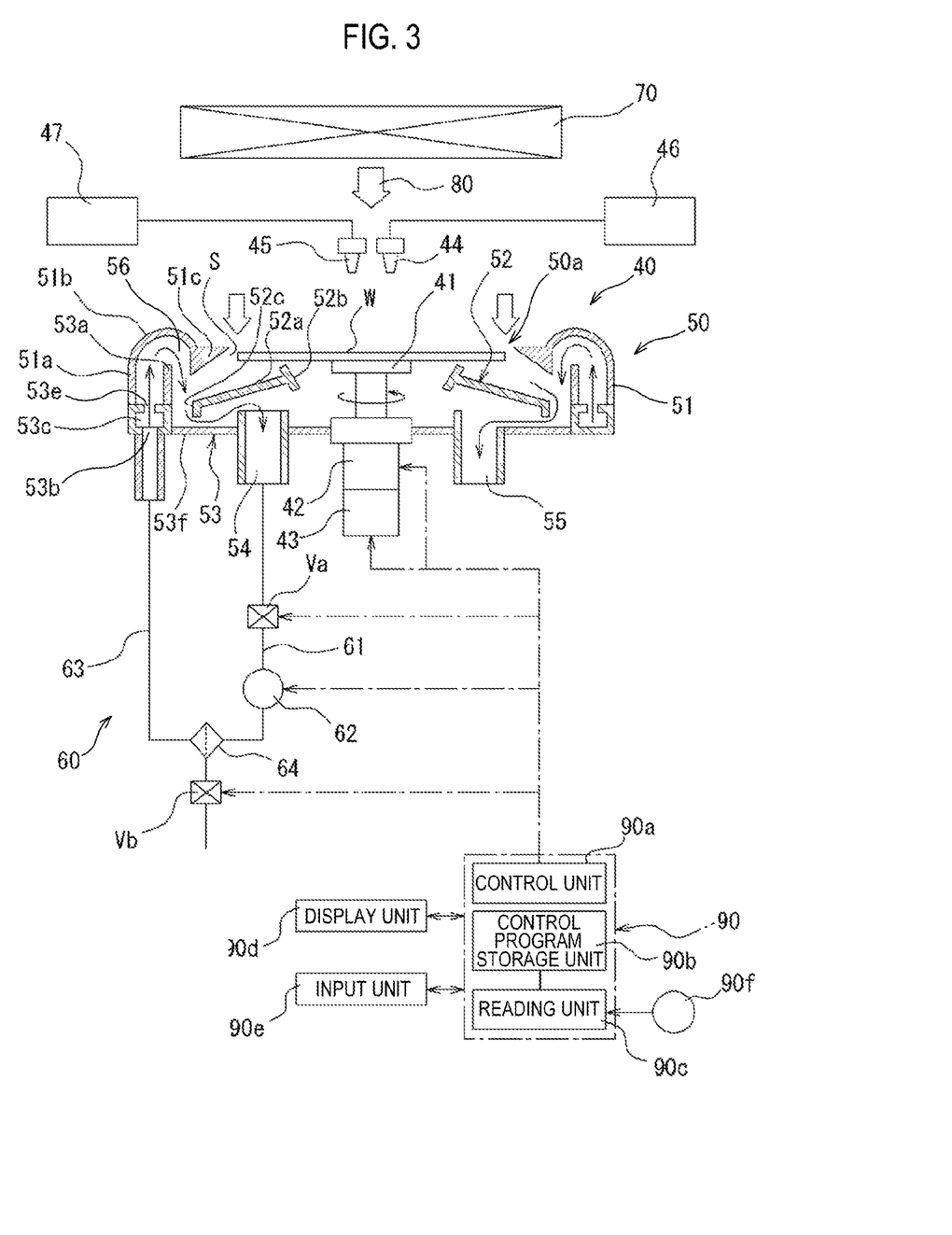
FIG. 3 is a schematic longitudinal sectional view of a coating apparatus employing a liquid processing apparatus according to a first embodiment of the present disclosure.
Figure 4:
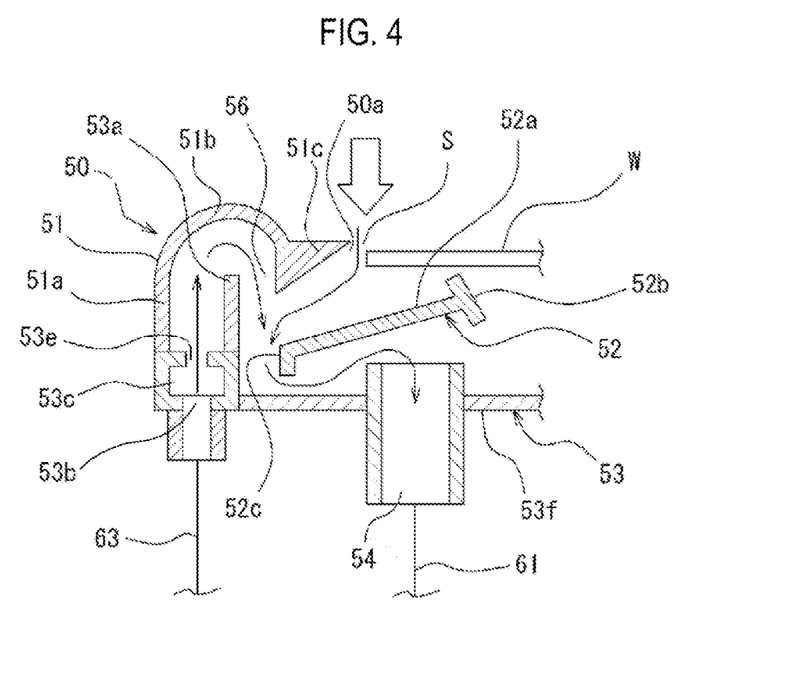
FIG. 4 is an enlarged sectional view showing major parts of the coating apparatus according to the first embodiment.
Figure 5:
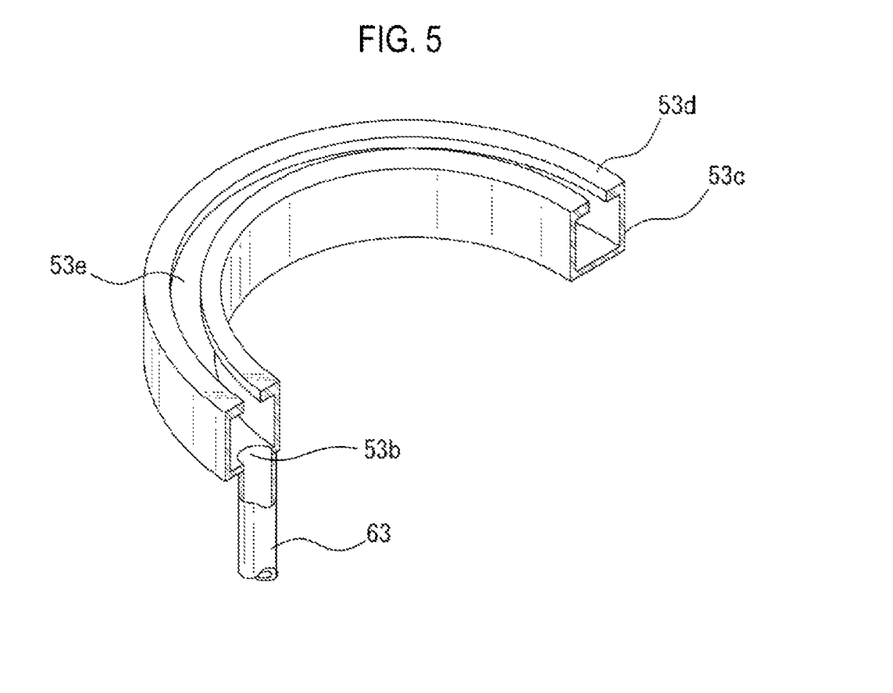
FIG. 5 is a sectional perspective view showing a connection portion of a processing cup according to the present disclosure and a circulation flow path.

As shown in FIG. 3, the resist coating apparatus 40 includes a spin chuck 41 arranged within a processing cup 50 having an open top end and configured to serve as a substrate holding unit for horizontally holding the wafer W, a rotating mechanism 42 configured to rotate the spin chuck 41 about a vertical axis, a lift mechanism 43 configured to move the spin chuck 41 up and down, a resist supply nozzle 44 (hereinafter referred to as resist nozzle 44) serving as a processing liquid supply unit for supplying (injecting) a resist liquid as a processing liquid on the surface of the wafer W, a solvent supply nozzle 45 (hereinafter referred to as thinner nozzle 45) configured to supply (inject) a solvent, e.g., a thinner, as a solvent for the resist liquid on the surface of the wafer W, a first nozzle moving mechanism 46 configured to move the resist nozzle 44 between a position at the upper side of the wafer W held in the spin chuck 41 and a standby position (not shown) at the outer side of the peripheral edge of the wafer W, a second nozzle moving mechanism 47 configured to move the thinner nozzle 45 between a position at the upper side of the wafer W held in the spin chuck 41 and a standby position (not shown) at the outer side of the peripheral edge of the wafer W, and an exhaust mechanism 60 configured to discharge an atmospheric gas existing around the wafer W held in the spin chuck 41.

The spin chuck 41 is configured to suck and hold the wafer W using a suction mechanism not shown in the drawings. At the upper side of the processing cup 50, a clean air 80 is supplied downwardly from a filter/fan unit 70 toward the wafer W.

The processing cup 50 is mainly composed of an outer cup 51 arranged to surround the outer periphery of the wafer W, an airflow-controlling middle cup 52 formed into a taper shape within the outer cup 51 so as to extend from a proximity portion existing below the wafer W toward the outer cup 51 and arranged to surround the spin chuck 41, and an inner cup 53 arranged below the middle cup 52 within the outer cup 51.

In this case, the outer cup 51 includes a cylindrical body portion 51a, a head portion 51b extending inward in an arc shape from the upper end of the body portion 51a, and an inner peripheral portion 51c extending from the inner periphery of the head portion 51b and provided with an inner circumferential surface whose diameter grows larger in an outward and downward direction. The inner peripheral portion 51c defines an opening portion 50a through which the wafer W is loaded and unloaded with respect to the processing cup 50.

The middle cup 52 includes a taper-shaped base portion 52a enlarged to surround the spin chuck 41, an inner peripheral piece 52b which extends from the upper end of the base portion 52a and provided with an inner circumferential surface whose diameter grows smaller in an inward and downward direction, and a suspending piece 52c extending downward in the vertical direction from the lower end of the base portion 52a to guide the recovered resist into the inner cup 53 of the processing cup 50.

The inner cup 53 is arranged inside the body portion 51a of the outer cup 51 and is formed into a cylindrical shape. In this case, a doughnut-shaped buffer portion 53c having an inlet port 53b connected to a circulation flow path 63 to be described later is formed between an outer wall portion 53a of the inner cup 53 and a lower end portion of the body portion 51a of the outer cup 51. An annular slit 53e is formed in a top portion 53d of the buffer portion 53c (see FIG. 5). In the buffer portion 53c configured as above, the circulation flow from the inlet port 53b into the buffer portion 53c is uniformly distributed into the processing cup 50 through the annular slit 53e. In a bottom portion 53f of the inner cup 53, there are formed an exhaust port 54 for discharging the mist generated within the processing cup 50 and a liquid drain port 55 for draining the resist liquid collected into the inner cup 53.

The wafer W accommodated within the processing cup 50 formed as described above is arranged with a gap S left between the wafer W and the processing cup 50 such that the peripheral portion of the wafer W becomes lower than the opening portion 50a of the processing cup 50.

The resist liquid supplied into the processing cup 50 and scattered from the wafer W in the processing cup 50 is collided with the inner peripheral portion 51c of the processing cup 50 and is collected into the processing cup 50. Since the atmospheric gas is sucked in a small amount through the gap S between the opening portion 50a and the peripheral portion of the wafer W, there is no possibility that the unnecessary atmospheric gas including the resist liquid turned to the mist within the processing cup 50 is leaked upward from the wafer W.

The exhaust mechanism 60 includes an exhaust flow path 61 communicating with the exhaust port 54 formed at the bottom portion 53f of the processing cup 50 at a first end thereof while communicating with an outside of the exhaust mechanism at a second end thereof, a blower fan 62 as an exhaust device installed in the exhaust flow path 61, a circulation flow path 63 branched from the exhaust flow path 61 at a branching portion and configured to communicate with the processing cup 50, a gas liquid separator 64 (hereinafter referred to as mist trap 64) installed in the branching portion of the exhaust flow path 61 and the circulation flow path 63 and configured to separate the exhaust gas containing the mist generated in the processing cup 50 into the mist and the gas, a first regulator valve Va installed at the first end the exhaust flow path 61 and formed of an auto damper capable of being opened and closed and capable of adjusting the opening degree, a second regulator valve Vb installed at the second end of the exhaust flow path 61 and capable of being opened and closed, and a control unit 90a configured to control the operations of the rotating mechanism 42, the blower fan 62, the first regulator valve Va and the second regulator valve Vb.

Figure 6A:
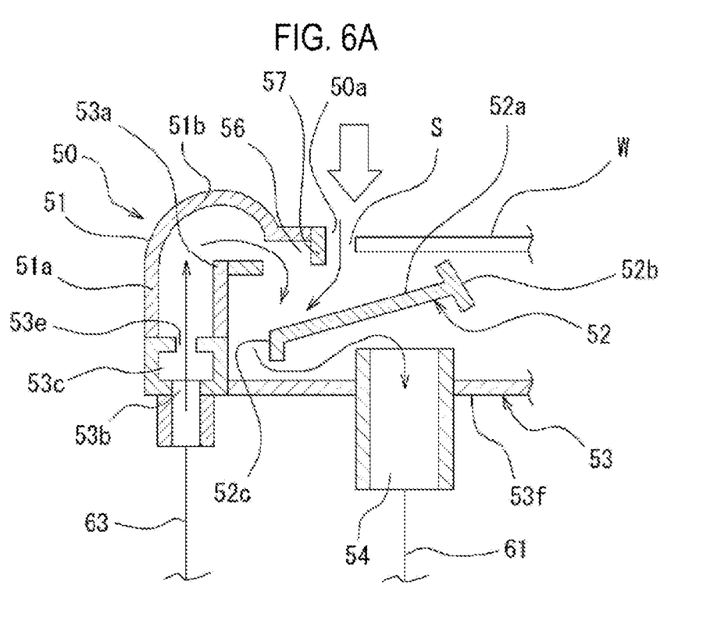
FIGS. 6A and 6B are enlarged sectional views showing another example of a circulating flow supply unit of the processing cup according to the present disclosure.
Figure 6B:
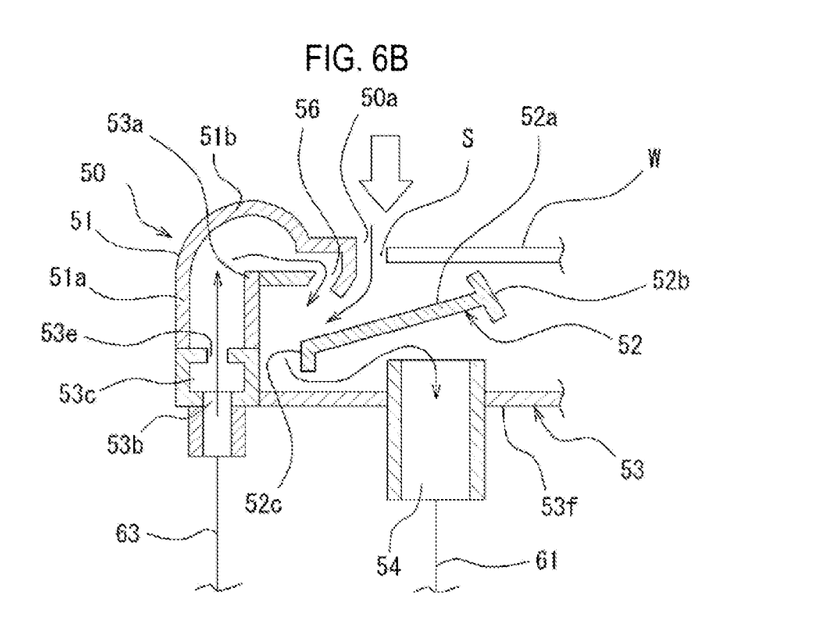

A supply port 56 is opened at the lower side of the gap S between the opening portion 50a of the processing cup 50 and the peripheral edge portion of the wafer W. The supply port 56 communicates with the circulation flow path 63. In this case, it is necessary to ensure that the gas flowing from the supply port 56 of the circulation flow path 63 into the processing cup 50 does not flow toward the wafer W. For that reason, the supply port 56 is opened downward. In order to effectively cause an ejector action performed by the gas flowing from the supply port 56 into the processing cup 50, it is preferred that the supply port 56 is positioned as close as possible to the gap S between the opening portion 50a of the processing cup 50 and the peripheral edge portion of the wafer W. For that reason, as shown in FIG. 6A, the supply port 56 may be a shape opened toward the wafer W with a baffle plate 57 by which the gas introduced from the supply port 56 into the processing cup 50 is prevented from flowing toward the wafer W. Alternatively, as shown in FIG. 6B, the supply port 56 may be opened radially outwardly with respect to the wafer W in the position near the wafer W.

A suction device not shown in the drawings is installed in the exhaust flow path 61. The suction device is configured to discharge the exhaust gas to the factory.

The control unit 90a, as shown in FIG. 3, controls the operation of the first nozzle moving mechanism 46 moving the resist nozzle 44 and the operation of the second nozzle moving mechanism 47 moving the thinner nozzle 45.

The control unit 90a is arranged within a control computer 90. The control computer 90 includes therein not only the control unit 90a but also a control program storage unit 90b configured to store a program for executing the respective processing operations in the below-mentioned process performed by the resist coating apparatus 40 and a reading unit 90c. The control computer 90 further includes an input unit 90e connected to the control unit 90a, a display unit 90d configured to display a screen of the processing operations for setting the processing operations, and a computer-readable non-transitory storage medium 90f inserted into the reading unit 90c. The storage medium 90f is configured to store the software for causing the control computer 90 to execute the control program. The control computer 90 is configured to output control signals to the respective units based on the control program. In this case, the opening degree of the first regulator valve Va can be arbitrarily set by the program of process recipes (e.g., the number of revolution of the wafer W, the rotation time of the wafer W, the supply amount of the resist liquid and the down-flow air volume) stored in the control program storage unit 90b of the control unit 90a.

The control program is stored in the storage medium 90f such as a hard disk, a compact disk, a flash memory, a flexible disk or a memory card. The control program is used by installing the control program from the storage medium 90f into the control computer 90.

Next, description will be made on the operation of the resist coating apparatus configured as above. If the wafer W is transferred to the resist coating apparatus 40 by the main transfer means A2, the wafer W is sucked and held in a substantially horizontal posture by the spin chuck 41 moved upward by the lift mechanism 43.

The wafer W sucked and held by the spin chuck 41 is moved into and accommodated within the processing cup 50 by the lift mechanism 43. A specified amount of solvent is supplied (injected) from the thinner nozzle 45 onto the center surface of the wafer W. Subsequently, the spin chuck 41 is rotated by the rotating mechanism 42. The solvent supplied onto the wafer W is diffused on the wafer W.

During the diffusion of the solvent, a resist liquid is supplied (injected) from the resist nozzle 44 and is diffused through a solvent film, whereby a resist film is formed on the wafer W (processing operation). In the processing operation, the surplus resist liquid scattered from the wafer W is collected by the processing cup 50. A part of the resist liquid becomes a mist within the processing cup 50.

During the processing operation, the first regulator valve Va is opened and the second regulator valve Vb is closed pursuant to the signals supplied from the control unit 90a. The gas separated by the mist trap 64 flows through the circulation flow path 63 and then flows into the processing cup 50 from the supply port 56 (exhaust gas circulating operation). Consequently, the gas flowing through the gap S between the opening portion 50a of the processing cup 50 and the peripheral portion of the wafer W, namely, the atmospheric gas around the wafer W within the processing cup 50, is guided toward the exhaust port 54 under the ejector action of the gas flowing into the processing cup 50. At this time, it is necessary that the circulation flow rate of the gas flowing through the circulation flow path 63 during the processing operation be kept constant in terms of the processing performance. For that reason, the circulation flow rate of the gas is controlled by adjusting the opening degree of the first regulator valve Va using the process-recipe-based control signal supplied from the control unit 90a.

After stopping the processing operation, the first regulator valve Va is closed and the second regulator valve Vb is opened, whereby the exhaust gas containing the mist separated by the mist trap 64 is discharged to the factory (discharging operation).

The series of operations described above are performed by allowing the control computer 90 to read out the control program stored in the memory of the control computer 90 and allowing the control computer 90 to output control signals for the operation of the respective mechanisms based on the read command. This is carried out by inserting the storage medium 90f, which stores the software for the control computer 90 to execute the control program, into the reading unit 90c.

Upon executing the control program, the control computer 90 controls the resist coating apparatus 40 so as to perform: a processing operation in which the resist film is formed on the surface of the wafer W by supplying (injecting) the resist liquid from the resist nozzle 44 onto the surface of the wafer W rotating about the vertical axis; an exhaust gas circulating operation in which the gas (exhaust gas) separated by the mist trap 64 is introduced into the processing cup 50 from the supply port 56 of the circulation flow path 63 by opening the first regulator valve Va in an adjustable manner and closing the second regulator valve Vb; and a discharging operation in which the exhaust gas existing within the exhaust flow path 61 is discharged by closing the first regulator valve Va and opening the second regulator valve Vb, wherein the exhaust gas circulating operation is performed during the processing operation such that the atmospheric gas around the wafer W within the processing cup 50 is guided toward the exhaust port 54 by the airflow introduced from the supply port 56 of the circulation flow path 63 into the processing cup 50 and wherein the discharging operation is performed after stopping the processing operation and the exhaust gas circulating operation.

With the resist coating apparatus 40 (the method) of the first embodiment, during the processing operation of forming the resist film on the surface of the wafer W by supplying the resist liquid from the resist nozzle 44 onto the surface of the wafer W rotating about the vertical axis, the mist generated during liquid processing is removed from the exhaust gas. Then the exhaust gas can be circulated through the processing cup 50 by opening the first regulator valve Va installed at the first end of the exhaust flow path 61 and closing the second regulator valve Vb installed at the second end of the exhaust flow path 61. The atmospheric gas existing around the wafer W within the processing cup 50 can be guided toward the exhaust port 54 under the ejector action caused by the airflow introduced into the processing cup 50. At this time, the circulation flow rate of the gas flowing through the circulation flow path 63 can be kept constant by adjusting the opening degree of the first regulator valve Va based on the process recipes. It is therefore possible to stabilize the processing performance.

The exhaust gas existing within the exhaust flow path 61 is discharged by closing the first regulator valve Va and opening the second regulator valve Vb after stopping the processing operation and the exhaust gas circulating operation, whereby the exhaust gas containing the mist remaining within the exhaust flow path 61 can be discharged to the factory. Accordingly, it may be possible to effectively use the exhaust gas and to reduce the flow rate of the exhaust gas discharged to the factory and the power consumption in discharging the exhaust gas to the factory. It is also possible to reduce the air flow supplied to the processing cup 50.

<Second Embodiment>

The second embodiment seeks to reduce the adverse influence on the liquid processing attributable to the gas (exhaust gas) circulating through the processing cup 50. In this regard, one of the major factors of the adverse influence is the existence of an organic component contained in the circulating gas (exhaust gas). Other factors of the adverse influence include the difference between the temperature of the circulating gas (exhaust gas) and the internal temperature of the processing cup 50 and the difference between the humidity of the circulating gas (exhaust gas) and the internal humidity of the processing cup 50.

Figure 7:
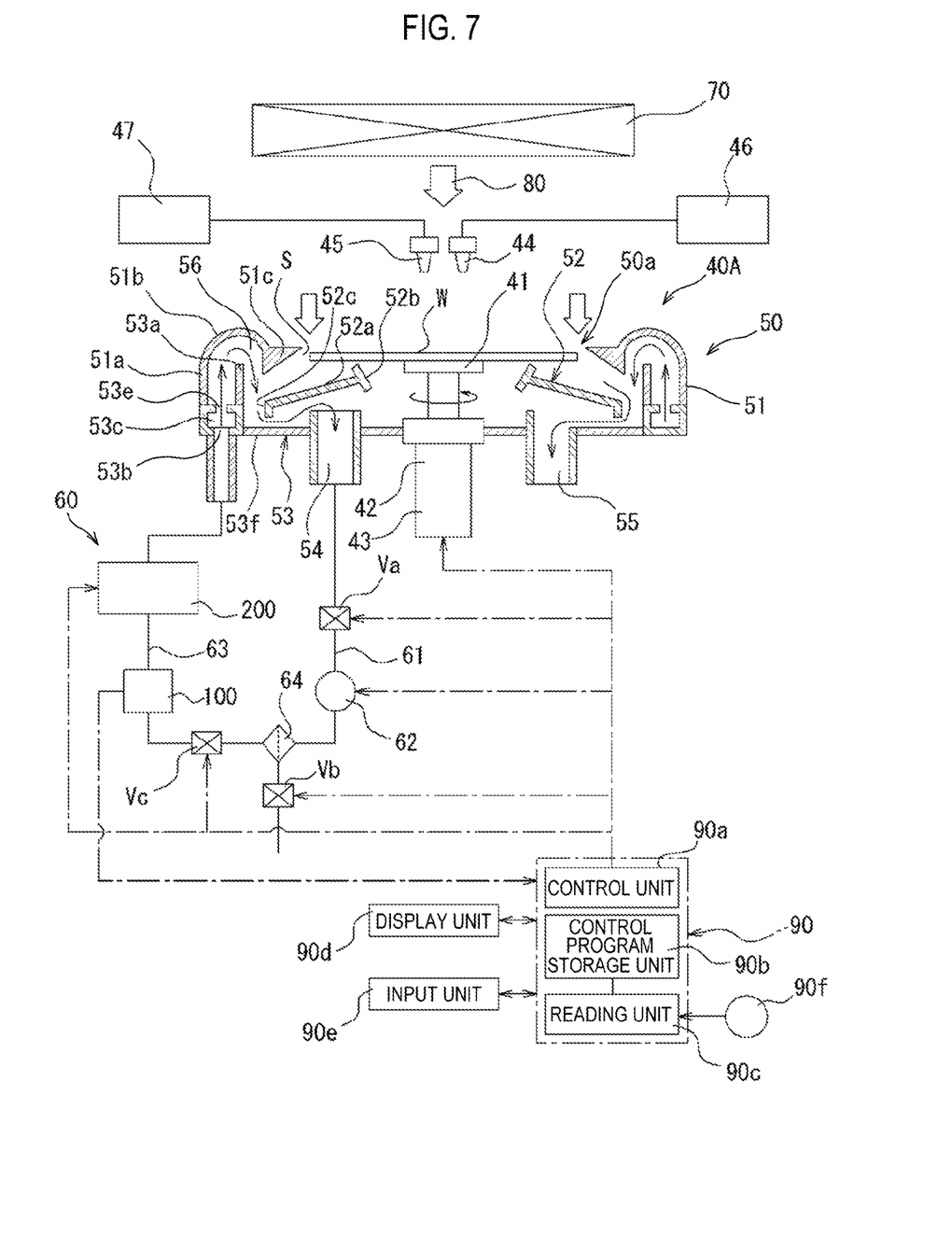
FIG. 7 is a schematic longitudinal sectional view of a coating apparatus employing a liquid processing apparatus according to a second embodiment of the present disclosure.

Next, the resist coating apparatus according to the second embodiment will be described with reference to FIG. 7. The liquid processing units and the processing cup of the second embodiment are the same as those of the first embodiment. Like parts will be designated by the same reference symbols and will not be described.

In the resist coating apparatus 40A of the second embodiment, the second regulator valve Vb installed at the second end of the exhaust flow path 61 can be opened and closed in an adjustable manner. In the circulation flow path 63 branched from the exhaust flow path 61, a third regulator valve Vc capable of being opened and closed, a concentration sensor 100 configured to measure the concentration of an organic component contained in the exhaust gas flowing through the circulation flow path 63 and a temperature/humidity regulator 200 configured to regulate at least one of the temperature and the humidity of the gas flowing through the circulation flow path 63 are installed in the named order from the mist trap 64 toward the supply port 56. The temperature/humidity regulator 200 is capable of regulating and keeping constant the temperature and/or the humidity of the gas flowing through the circulation flow path 63. If it is necessary to regulate only the temperature or the humidity of the gas flowing through the circulation flow path 63, a temperature regulator configured to regulate only the temperature or a humidity regulator configured to regulate only the humidity may be used in place of the temperature/humidity regulator 200. Even if there is a need to regulate both the temperature and the humidity, it may be possible to use a mono-functional temperature regulator and a mono-functional humidity regulator.

The opening/closing operation and the opening degree adjusting operation of the second regulator valve Vb, the opening/closing operation of the third regulator valve Vc and the operation of the temperature/humidity regulator 200 are controlled by the control unit 90a. Responsive to the detection signal supplied from the concentration sensor 100, the control unit 90a determines which state the concentration of the organic component measured by the concentration sensor 100 belongs to, referring to a specified concentration (B/ppm) to be considered detrimental and a permissible concentration (A/ppm). By the control unit 90a, the temperature and the humidity of the down-flow gas (air 80) introduced into the processing cup 50 from a position above the processing cup 50 and the temperature and the humidity of the gas (exhaust gas) flowing through the circulation flow path 63 are kept to be constant (e.g., at 23 degrees C. and 45% RH).

Figure 8:
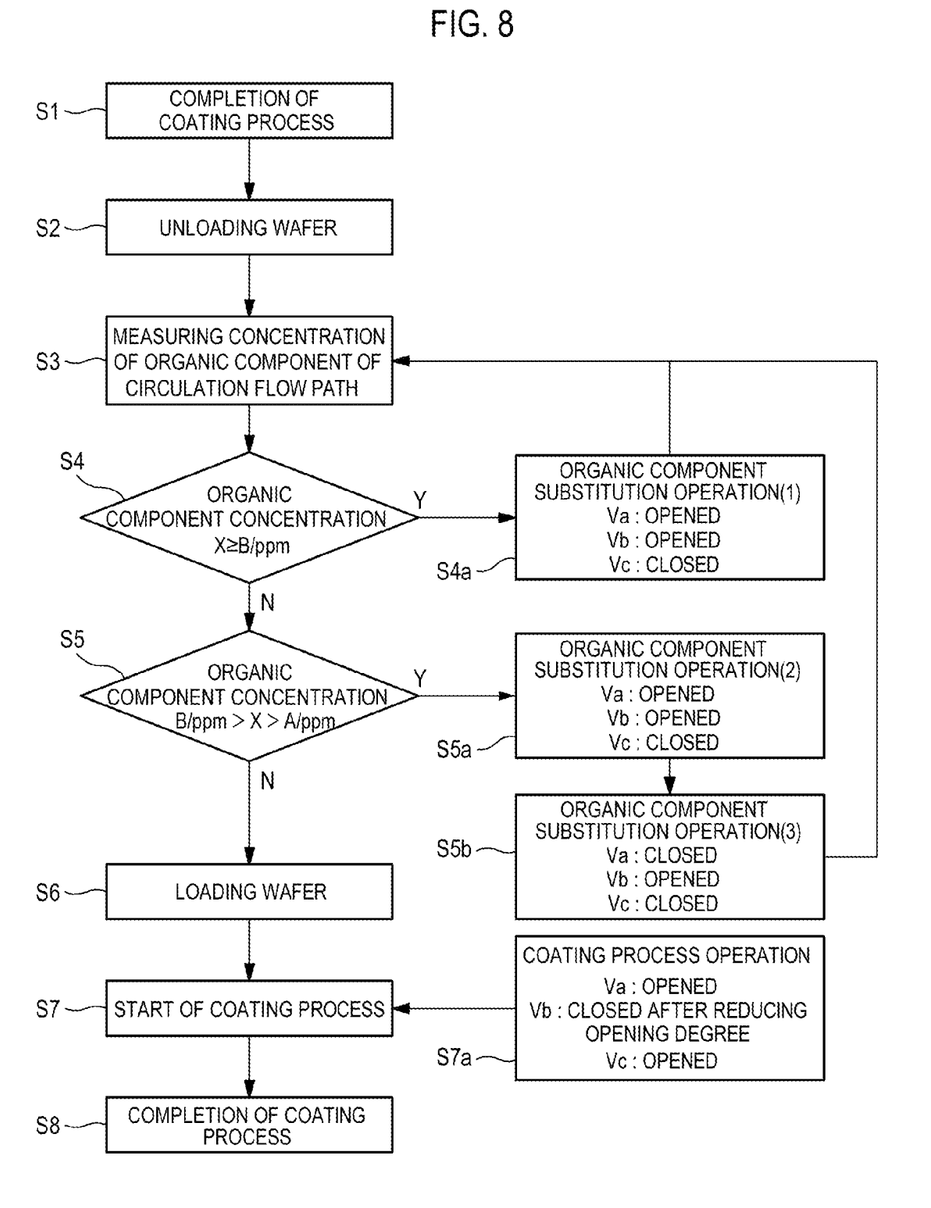
FIG. 8 is a flowchart illustrating operations of a liquid processing method according to the second embodiment of the present disclosure.

Next, the operation of the resist coating apparatus 40A of the second embodiment will be described with reference to the flowchart illustrated in FIG. 8. The processing operation of the second embodiment is the same as that of the first embodiment and will not be described here.

In the second embodiment, during the processing operation, the first regulator valve Va and the third regulator valve Vc are opened and the second regulator valve Vb is closed in response to the signals supplied from the control unit 90a. The gas separated in the mist trap 64 flows through the circulation flow path 63 and then flows into the processing cup 50 from the supply port 56 (exhaust gas circulating operation). Consequently, the gas flowing through the gap S between the opening portion 50*a* of the processing cup 50 and the peripheral portion of the wafer W, namely the atmospheric gas around the wafer W within the processing cup 50, is guided toward the exhaust port 54 under the ejector action of the gas introduced into the processing cup 50 from the supply port 56. At this time, it is necessary that the circulation flow rate of the gas flowing through the circulation flow path 63 during the processing operation be kept constant in terms of the processing performance. Accordingly, the circulation flow rate of the gas is controlled by adjusting the opening degree of the first regulator valve Va using the process-recipe-based control signal supplied from the control unit 90*a*.

After stopping the processing operation, the first regulator valve Va and the third regulator valve Vc are closed and the second regulator valve Vb is opened, whereby the exhaust gas containing the mist separated by the mist trap 64 is discharged to the factory (discharging operation).

The first coating process is completed in the manner described above (operation S1). Thereafter, the wafer W is unloaded from the processing cup 50 (operation S2).

After unloading the wafer W from the processing cup 50, the organic component concentration of the exhaust gas existing in the circulation flow path 63 is measured by the concentration sensor 100 (operation S3). Determination is made as to whether the measured organic component concentration (X/ppm) is equal to or higher than the specified concentration (B/ppm) which is considered detrimental (operation S4). If the organic component concentration of the gas (exhaust gas) existing in the circulation flow path 63 is equal to or higher than the specified concentration (B/ppm), the exhaust gas is discharged to the factory by opening the first regulator valve Va and the second regulator valve Vb and closing the third regulator valve Vc (organic component substitution operation (1): operation S4*a*).

Determination is made as to whether the organic component concentration is in a range between the specified concentration (B/ppm) and the permissible concentration (A/ppm) (operation S5). If the organic component concentration is lower than the specified concentration (B/ppm) but higher than the permissible concentration (A/ppm), the exhaust gas existing in the exhaust flow path 61 is discharged by opening the first regulator valve Va and the second regulator valve Vb and closing the third regulator valve Vc (organic component substitution operation (2): operation S5*a*). Thereafter, the gas remaining in the exhaust flow path 61 is discharged by closing the first regulator valve Va (organic component substitution operation (3): operation S5*b*). If the organic component concentration becomes equal to or lower than the permissible concentration (A/ppm), the wafer W is loaded into the processing cup 50 (operation S6) and the coating process is initiated (operation S7). During the coating process, by opening the first regulator valve Va and the third regulator valve Vc and closing the second regulator valve Vb after reducing the opening degree thereof, the gas (exhaust gas) obtained by removing the mist from the exhaust gas flowing through the exhaust flow path 61 is introduced into the processing cup 50 from the supply port 56 of the circulation flow path 63 in the same manner as described above. The atmospheric gas around the wafer W within the processing cup 50 is guided toward the exhaust port 54 (coating process operation: operation S7*a*). The second coating process is completed in the manner described above (operation S8).

The series of operations described above are performed by allowing the control computer 90 to read out the control program stored in the memory of the control computer 90 and allowing the control computer 90 to output control signals for the operation of the respective mechanisms based on the read command. This is carried out by inserting the storage medium 90*f*, which stores the software for causing the control computer 90 to execute the control program, into the reading unit 90*c*.

Upon executing the control program, the control computer 90 controls the resist coating apparatus 40 so as to perform: a processing operation in which the resist film is formed on the surface of the wafer W by supplying, i.e., injecting the resist liquid from the resist nozzle 44 onto the surface of the wafer W rotating about the vertical axis; an exhaust gas circulating operation in which the exhaust gas separated by the mist trap 64 is introduced into the processing cup 50 from the supply port 56 of the circulation flow path 63 by opening the first regulator valve Va in an opening-degree-adjustable manner, opening the third regulator valve Vc and closing the second regulator valve Vb; a discharging operation in which the exhaust gas existing within the exhaust flow path 61 is discharged by opening the first regulator valve Va and the second regulator valve Vb and closing the third regulator valve Vc; and an organic component concentration measuring operation in which the organic component concentration of the exhaust gas existing in the circulation flow path 63 is measured by the concentration sensor 100, wherein the organic component concentration measuring operation is performed after the processing operation such that, if the organic component concentration of the exhaust gas existing in the circulation flow path 63 is equal to or higher than the specified concentration (B/ppm) which is considered detrimental, the exhaust gas is discharged to the factory by opening the first regulator valve Va and the second regulator valve Vb and closing the third regulator valve Vc and such that, if the organic component concentration is lower than the specified concentration (B/ppm) but higher than the permissible concentration (A/ppm), the exhaust gas existing in the exhaust flow path 61 is discharged by opening the first regulator valve Va and the second regulator valve Vb and closing the third regulator valve Vc and then the gas remaining in the exhaust flow path 61 is discharged by closing the first regulator valve Va.

With the resist coating apparatus 40A (the method) of the second embodiment, during the processing operation of forming the resist film on the surface of the wafer W by supplying the resist liquid from the resist nozzle 44 onto the surface of the wafer W rotating about the vertical axis, the mist generated during liquid processing is removed from the exhaust gas. Then the exhaust gas can be circulated through the processing cup 50 by opening the first regulator valve Va installed at the first end of the exhaust flow path 61 and the third regulator valve Vc and closing the second regulator valve Vb installed at the second end of the exhaust flow path 61. The atmospheric gas around the wafer W within the processing cup 50 can be guided toward the exhaust port 54 under the ejector action caused by the airflow introduced into the processing cup 50. At this time, the circulation flow rate of the gas flowing through the circulation flow path 63 can be kept constant by adjusting the opening degree of the first regulator valve Va based on the process recipes. It is therefore possible to stabilize the processing performance.

After the processing operation, the organic component concentration of the exhaust gas existing in the circulation flow path 63 is measured by the concentration sensor 100. If the organic component concentration of the gas (exhaust gas) existing in the circulation flow path 63 is equal to or higher than the specified concentration (B/ppm) which is considered detrimental, the exhaust gas can be discharged by opening the first regulator valve Va and the second regulator valve Vb and closing the third regulator valve Vc. If the organic component concentration is lower than the specified concentration (B/ppm) but higher than the permissible concentration (A/ppm), the exhaust gas can be discharged by opening the first regulator valve Va and the second regulator valve Vb and closing the third regulator valve Vc and then the gas remaining in the exhaust flow path 61 can be discharged by closing the first regulator valve Va. If the organic component concentration is equal to or lower than the permissible concentration (A/ppm), the processing operation is performed by opening the first regulator valve Va and the third regulator valve Vc and closing the second regulator valve Vb after reducing the opening degree thereof. Thus, as described above, the mist generated from liquid processing is removed from the exhaust gas. Then the exhaust gas can be circulated through the processing cup 50. The atmospheric gas existing around the wafer W within the processing cup 50 can be guided toward the exhaust port 54 under the ejector action caused by the airflow introduced into the processing cup 50.

The temperature/humidity regulator 200 installed in the circulation flow path 63 is controlled by the control unit 90a to make constant the temperature and/or the humidity of the gas introduced into the processing cup 50 from the position above the processing cup 50 and the temperature and/or the humidity of the gas introduced into the processing cup 50 from the circulation flow path 63. This makes it possible to keep constant the temperature and/or the humidity of the processing atmosphere within the processing cup 50.

<Other Embodiments>While the present disclosure has been described above with reference to certain embodiments, the present disclosure is not limited to the aforementioned embodiments but may be modified in many different forms without departing from the scope of the subject matters recited in the claims.

For example, in the aforementioned embodiments, description has been made on an instance where the mist trap 64 is installed in the branching portion of the exhaust flow path 61 and the circulation flow path 63. However, the mist trap 64 need not be necessarily installed in the branching portion. For instance, the mist trap 64 may be installed at the first end (the inlet side of the branching portion) of the exhaust flow path 61 including the branching portion or in the circulation flow path 63.

In the first embodiment, the temperature/humidity regulator 200 configured to regulate at least one of the temperatures and the humidity of the gas flowing through the circulation flow path 63 may be installed in the circulation flow path 63 and may be controlled by the control unit 90a. In this case, it is possible to make constant the temperature and/or the humidity of the gas introduced into the processing cup 50 from above the processing cup 50 and from the circulation flow path 63. Keeping the temperature and/or the humidity of the gas constant may result in the constant temperature and/or the humidity of the processing atmosphere within the processing cup 50.

In the aforementioned embodiments, description has been made on an instance where the circulating exhaust gas is supplied from the supply port 56 formed at the outer cup 51. However, the supply port may be formed in other locations such as a space above substrate where the circulating exhaust gas is hard to reach. For instance, the supply port may be formed below the spin chuck 41. In this case, the circulating gas is hard to reach the front surface of the substrate and does not affect the liquid processing of the substrate. It is also possible to restrain the space existing at the rear surface of the substrate from being depressurized along with the rotation of the substrate. This makes it possible to restrain the processing liquid or the atmospheric gas from going toward the rear surface of the substrate. As a result, it becomes possible to prevent the rear surface of the substrate from being contaminated.

In accordance with the present disclosure, by circulating the exhaust gas through the processing cup after the mist generated by liquid processing is removed from the exhaust gas, the gas flowing through the gap between the opening portion of the processing cup and the peripheral portion of the substrate can be guided toward the exhaust port. Accordingly, it is possible to effectively use the exhaust gas and to reduce the flow rate of the exhaust gas discharged to the factory and the power usage required in discharging the exhaust gas to the factory. It is also possible to reduce the air flow supplied to the processing cup.

In the aforementioned embodiments, description has been made on an instance where the liquid processing apparatus (method) according to the present disclosure is applied to the resist coating apparatus. However, the present disclosure may be applied to not only the resist coating apparatus but also a liquid processing apparatus configured to form a processing liquid film by supplying a processing liquid from a processing liquid supply unit onto a substrate surface such as a wafer accommodated within the processing cup 50 and provided with an exhaust mechanism for discharging a gas existing around a substrate held by a substrate holding unit.

The present disclosure can be applied to not only the silicon wafer but also a glass substrate for flat panel display.

While certain embodiments have been described, these embodiments have been presented by way of example only and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A liquid processing apparatus, comprising:
a substrate holding unit arranged within a processing cup having an open top end and configured to horizontally hold a substrate;
a rotating mechanism configured to rotate the substrate holding unit about a vertical axis;
a processing liquid supply unit configured to supply a processing liquid onto a surface of the substrate; and
an exhaust mechanism configured to discharge an atmospheric gas around the substrate held by the substrate holding unit,
wherein the exhaust mechanism includes:
an exhaust flow path communicating with an exhaust port formed in a bottom portion of the processing cup at a first end while communicating with an outside at a second end and provided with an exhaust device installed in the exhaust flow path;
a circulation flow path branched from a branching portion of the exhaust flow path to communicate with the processing cup;
a gas liquid separator installed at the branching portion, and configured to separate the atmospheric gas into a mist and a gas;
a first regulator valve installed at the first end of the exhaust flow path and capable of being opened and closed and capable of adjusting an opening degree; and a second regulator valve installed at the second end of the exhaust flow path and capable of being opened and closed.

2. The apparatus of claim 1, further comprising: a control unit configured to control operations of the rotating mechanism, the exhaust device, the first regulator valve and the second regulator valve, wherein, based on a control signal supplied from the control unit, during a processing operation of forming a processing liquid film on the substrate surface by supplying the processing liquid from the processing liquid supply unit onto the surface of the substrate under rotation, the gas separated by the gas liquid separator is introduced into the processing cup from the circulation flow path by opening the first regulator valve and closing the second regulator valve and the atmospheric gas around the substrate within the processing cup is guided toward the exhaust port by the gas introduced into the processing cup, and after stopping the processing operation, the gas remaining within the exhaust flow path is discharged by closing the first regulator valve and opening the second regulator valve;

wherein a supply port is formed below a gap between an opening portion of the processing cup and a peripheral portion of the substrate, the supply port communicating with the circulation flow path; and wherein a flow rate of the gas flowing through the circulation flow path is kept constant by adjusting the opening degree of the first regulator valve.

3. The apparatus of claim 1, wherein the second regulator valve is formed such that an opening degree thereof is adjustable;

a third regulator valve and a concentration sensor configured to measure an organic component concentration are arranged in the circulation flow path in a direction from the gas liquid separator toward a supply port;

the apparatus further comprises a control unit configured to control operations of the rotating mechanism, the exhaust device, the first regulator valve and the second regulator valve and to control an operation of the third regulator valve in response to a detection signal supplied from the concentration sensor;

based on control signals supplied from the control unit, during a processing operation of supplying the processing liquid from the processing liquid supply unit onto the surface of the substrate under rotation, the gas separated by the gas liquid separator is introduced into the processing cup from the circulation flow path by opening the first regulator valve and the third regulator valve and closing the second regulator valve and the atmospheric gas around the substrate within the processing cup is guided toward the exhaust port by the gas introduced into the processing cup;

after stopping the processing operation, the gas remaining within the exhaust flow path is discharged by closing the first regulator valve and the third regulator valve and opening the second regulator valve;

if the organic component concentration of the gas existing in the circulation flow path is equal to or higher than a specified concentration, the gas is discharged by opening the first regulator valve and the second regulator valve and closing the third regulator valve;

if the organic component concentration is lower than the specified concentration and higher than a permissible concentration, the gas is discharged by opening the first regulator valve and the second regulator valve and closing the third regulator valve and then the gas remaining in the exhaust flow path is discharged by closing the first regulator valve;

if the organic component concentration is equal to or lower than the permissible concentration, the processing operation is performed by opening the first regulator valve and the third regulator valve and closing the second regulator valve after reducing the opening degree of the second regulator valve;

wherein the supply port is formed below a gap between an opening portion of the processing cup and a peripheral portion of the substrate, the supply port communicating with the circulation flow path; and wherein a flow rate of the gas flowing through the circulation flow path is kept constant by adjusting the opening degree of the first regulator valve.

4. The apparatus of claim 2, wherein a temperature/humidity regulator configured to regulate at least one of the temperature and the humidity is installed in the circulation flow path, the temperature/humidity regulator controlled by a control unit to make constant the temperature and/or the humidity of the gas introduced into the processing cup from above the processing cup and the temperature and/or the humidity of the gas introduced into the processing cup from the circulation flow path.

5. The apparatus of claim 2, wherein a baffle plate configured to prevent the gas introduced from the circulation flow path into the processing cup from flowing toward the substrate is installed in the supply port of the circulation flow path.

6. The apparatus of claim 2, wherein the supply port of the circulation flow path is opened radially outwardly with respect to the substrate held by the substrate holding unit.

* * * * *